United States Patent
Chu et al.

(10) Patent No.: US 7,895,554 B2
(45) Date of Patent: Feb. 22, 2011

(54) VERIFICATION METHOD WITH THE IMPLEMENTATION OF WELL VOLTAGE PSEUDO DIODES

(75) Inventors: Wen-Hwa M. Chu, Plano, TX (US); Shaibal Barua, Allen, TX (US); Lily X. Springer, Dallas, TX (US); James Homack, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 386 days.

(21) Appl. No.: 11/962,945

(22) Filed: Dec. 21, 2007

(65) Prior Publication Data
US 2008/0189666 A1 Aug. 7, 2008

Related U.S. Application Data

(60) Provisional application No. 60/871,183, filed on Dec. 21, 2006.

(51) Int. Cl.
*G06F 9/455* (2006.01)
(52) U.S. Cl. .............. 716/107; 716/111; 716/118; 716/119; 438/570; 438/571
(58) Field of Classification Search ............. 716/4–5, 716/8–11; 438/570–571
See application file for complete search history.

(56) References Cited

U.S. PATENT DOCUMENTS

| 5,392,222 | A  | * | 2/1995 | Noble ........................ 716/19 |
| 5,818,084 | A  | * | 10/1998 | Williams et al. ............. 257/329 |
| 7,240,312 | B2 | * | 7/2007 | Dang et al. .................... 716/5 |
| 7,348,855 | B2 | * | 3/2008 | Wu ............................ 330/300 |
| 7,562,315 | B2 | * | 7/2009 | Springer et al. ................ 716/1 |
| 7,774,727 | B2 | * | 8/2010 | Arizono ......................... 716/5 |

\* cited by examiner

*Primary Examiner*—Nghia M Doan
(74) *Attorney, Agent, or Firm*—Warren L. Franz; Wade J. Brady, III; Frederick J. Telecky, Jr.

(57) ABSTRACT

A method of verifying consistency between a circuit schematic and a corresponding integrated circuit layout is disclosed. The method includes identifying a voltage condition associated with a portion of the circuit schematic, and assigning a pseudo diode to the portion of the circuit schematic that is uniquely associated with the identified voltage condition. The method further includes coding a pseudo layer associated with an integrated circuit layout of the circuit schematic in accordance with content of the assigned pseudo diode, and verifying consistency between the circuit schematic and the corresponding integrated circuit layout by extracting the pseudo layer from the integrated circuit layout and comparing information of the pseudo layer to the assigned pseudo diode in the circuit schematic.

9 Claims, 2 Drawing Sheets

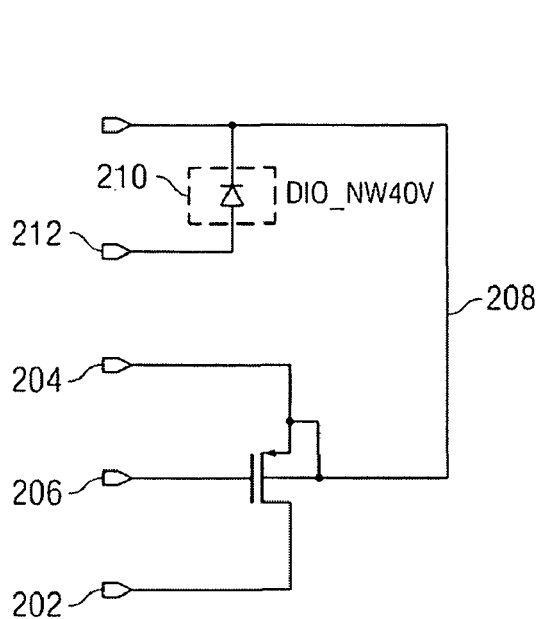
FIG. 2
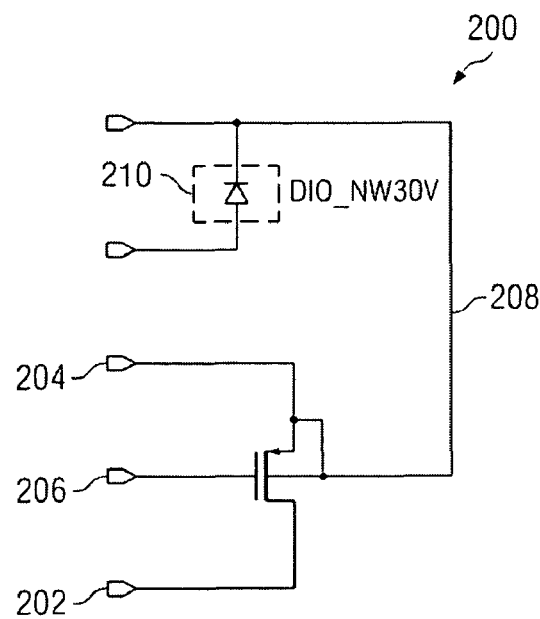
FIG. 3
| NWELL PSEUDO DIODE CDK NAME | PSEUDO LAYER USED | SPICE MODEL NAME | BREAKDOWN VMAX |
|---|---|---|---|
| DIO_NW40V | NONE | DIO_WELL_V40_LBC7 | 41V |
| DIO_NW30V | V30 | DIO_WELL_V30_LBC7 | 31V |
| DIO_NW20V | V20 | DIO_WELL_V20_LBC7 | 21V |
| DIO_NW7V | NW7V OR NW3V | DIO_WELL_V7_LBC7 | 7.7V |
| DIO_NWDPN40V | NONE | DIO_WELL_V40_LBC7 | 41V |
| DIO_NWDPN40V | V30 | DIO_WELL_V30_LBC7 | 31V |
FIG. 4

VERIFICATION METHOD WITH THE IMPLEMENTATION OF WELL VOLTAGE PSEUDO DIODES

REFERENCE TO RELATED APPLICATIONS

This application claims priority to Ser. No. 60/871,183 filed Dec. 21, 2006, which is entitled, "A Verification Method with the Implementation of Well Voltage Pseudo Diodes."

FIELD OF INVENTION

The present invention relates generally to semiconductor fabrication, and more particularly to voltage rule verification in design layout.

BACKGROUND OF THE INVENTION

It can be appreciated that different design rules are applied on areas of semiconductor devices operating at different voltage levels. For example, in a mixed signal design an isolated P-well and an N isolation ring may operate at voltages different from that of the global substrate, for example. Accordingly, it can be appreciated that it is important to test the different areas to see if they comply with respective voltage rules. Such voltage rules are generally implemented in software that is applied to a proposed design layout. Stated another way, a proposed layout (e.g., for a mixed signal circuit) is run through certain voltage dependent design rule software whereby a 'red flag' is raised if certain voltage rule requirements are not met or certain voltage rules are otherwise violated.

Nevertheless, it would be desirable to provide improvements in the manner in which such voltage rules are communicated between circuit schematics and the resultant layout.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to the application of voltage rules to proposed circuit design layouts.

In one embodiment of the invention, a method of verifying consistency between a circuit schematic and a corresponding integrated circuit layout is disclosed. The method comprises identifying a voltage condition associated with a portion of the circuit schematic, and assigning a pseudo diode to the portion of the circuit schematic that is uniquely associated with the identified voltage condition. The method further comprises coding a pseudo layer associated with an integrated circuit layout of the circuit schematic in accordance with content of the assigned pseudo diode, and verifying consistency between the circuit schematic and the corresponding integrated circuit layout by extracting the pseudo layer from the integrated circuit layout and comparing information of the pseudo layer to the assigned pseudo diode in the circuit schematic.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 2 is a schematic diagram illustrating a circuit schematic using a first type of pseudo device according to one or more aspects of the present invention;

FIG. 3 is a schematic diagram illustrating another circuit schematic using a second type of pseudo device according to one or more aspects of the present invention; and FIG. 4 is a chart illustrating example naming or labeling conventions for pseudo devices used in accordance with one or more aspects of the invention.

DETAILED DESCRIPTION OF THE INVENTION

Figure 1:
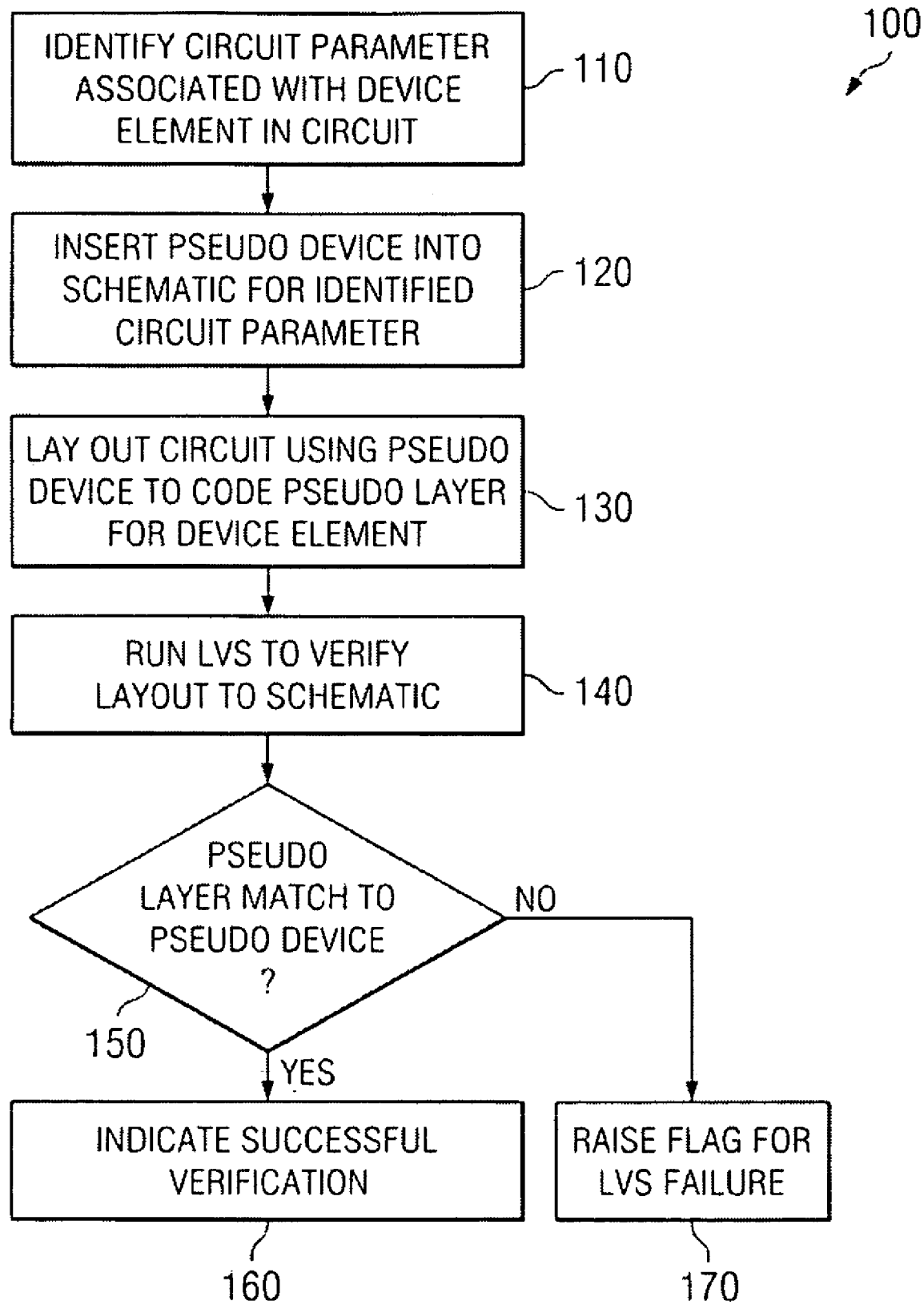
FIG. 1 is a flow chart diagram illustrating a method according to one embodiment of the invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The invention relates to a method of providing verification between substantive content of a device within a circuit schematic and the resultant layout of the integrated circuit include the device.

The inventors of the present invention appreciated that in prior art schematic circuit diagrams, certain types of circuit parameters associated with a given device in the schematic were not provided. For example, in PMOS transistor devices having an N-well residing in a P-type semiconductor body, the voltage condition or conditions that the N-well was expected to experience in operation were not provided. In order for layout specialists to properly lay out a device to comport with needed design rule requirements, a circuit designer had to manually communicate the voltage condition or manually write text on the schematic. This type of arrangement was prone to mistakes being made.

Further, the inventors of the present invention appreciated that after a layout was completed, the pseudo layer coded into the layout did not correspond to anything in the circuit schematic, and thus during LVS verification, any information in the coded pseudo layer was not utilized. Rather, such information was used primarily for design rule checking (DRC). Thus, the pseudo layer information was used to verify that the requisite design rules were complied with; however, there was not an easy or automated way to ensure that the condition in the schematic matched the design rule being employed in the corresponding device in the layout.

A method of verifying a schematic circuit with a layout associated therewith is illustrated in FIG. 1 at reference numeral 100. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the design and fabrication of ICs having transistors illustrated and described herein, as well as in association with other transistors and structures not illustrated, including but not limited to NMOS and/or PMOS transistors.

Initially, a circuit parameter associated with a device element in a circuit is identified at 110. While the present invention contemplates a relevant circuit parameter, in one embodiment such a circuit parameter comprises a voltage condition associated with a part of the circuit schematic. For example, for a PMOS transistor, the source/drain regions are formed in an N-well that resides in a P-type semiconductor body, such as a substrate or p-epi region in bulk or over isolation in an SOI device. For different PMOS devices in the circuit, the expected N-well voltage information associated therewith may vary. For example, the expected voltage may vary based upon the way a particular PMOS is used in the circuit, wherein a range may vary, for example, from 7V to 40V. With different requirements of the PMOS transistor devices, different layouts should be employed. For example, design rules for a higher voltage may require increased spacing between neighboring N-wells. Other design rules associated with the device may also be affected.

Based on the identified circuit parameter at 110, a pseudo device is inserted into the circuit schematic at 120 to account for that identified parameter. While any type of pseudo device may be employed and is contemplated as falling within the scope of the invention, in one example embodiment a pseudo diode is inserted into the circuit schematic. In this embodiment, the pseudo diode is attached to the backgate of the PMOS transistor and reflects the PN junction between the N-well and the underlying P-type semiconductor body. The pseudo device therefore resides on the schematic and indicates to the layout specialist a circuit parameter or condition for that particular device element in the circuit.

Upon completion of the circuit schematic, the layout specialist lays out the integrated circuit based upon the schematic diagram content. At 130 the layout specialist uses the pseudo device to lay out the corresponding circuit element in accordance therewith. In one example embodiment a spacing between the N-well within the circuit element (e.g., a PMOS transistor) and a neighboring N-well is dictated by the details of the pseudo device. For example, for a pseudo diode of 40V, a different layout spacing is employed for the neighboring N-well compared to a case where the pseudo diode is a 30V device. In addition, the layout specialist uses the pseudo device specifics to code the pseudo layer that is subsequently employed for computer-assisted device rule checking (DRC). That is, after layout is complete, the DRC algorithm employs the pseudo layer information to employ a unique set of layout design rules to the layout when performing a computer-assisted check on whether the resultant layout of that particular device complies with the requisite design rules. If the DRC fails, the failure can be individually checked and design rule violations can be remedied by fixing the layout or the failure can be manually accepted as a permitted violation.

The method 100 continues at 140, wherein a computer-assisted layout versus schematic (LVS) algorithm operation is performed in which the coded pseudo layer information in the layout is compared with the corresponding pseudo device in the schematic diagram. At 150 a query is made whether the pseudo layer information matches the pseudo device content information. If there is a match (YES at 150), then a successful verification is established at 160, at least with respect to that particular portion of the LVS. If, on the other hand, the pseudo layer information does not match the pseudo device data (NO at 150), then a flag or error notification is made to communicate that the layout does not comport with the schematic at 170.

In the above manner, the method 100 of FIG. 1 allows for substantive content such as voltage information or other circuit parameter information that is pertinent to layout to be communicated in the schematic to the layout specialist. Further, the present invention facilitates a computer-assisted check that the layout matches the schematic with respect to that circuit parameter information via a comparison of pseudo layer information in the layout to the pseudo device in the schematic via the LVS algorithm check. In the above manner, a reliability of the layout is improved.

Examples of employing a pseudo device in a portion of a circuit schematic is illustrated in FIGS. 2 and 3. In FIG. 2, a PMOS device 200 has a drain terminal 202, a source terminal 204, a gate terminal 206, and an N-well terminal 208. The N-well 208 in this particular PMOS device resides in a P-type semiconductor body. As illustrated, the N-well 208 has a schematic node 208, but also has a pseudo device 210, in this particular embodiment a pseudo diode labeled DIO_NW40V that symbolizes the substantive voltage content associated with this particular PMOS device 200. The pseudo diode 210 is coupled between the N-well (backgate) 208 and the P-semiconductor body (P-substrate) node 212 and reflects the reverse-biased PN junction at the N-well/P-semiconductor body interface. The pseudo tag provided thereto can be any relevant identifier that indicates to the layout specialist that a particular circuit parameter (e.g., a voltage condition) is associated with the device. The layout specialist will then layout the PMOS device 200 appropriately, given the 40V N-well voltage condition, which may impact various layout considerations, such as N-well to N-well spacing, etc. The layout specialist will also code that circuit parameter, NW40V, into the pseudo layer of the layout for subsequent use in computer-assisted LVS verification.

Turning to FIG. 3, a PMOS device 200 is illustrated in a portion of a circuit schematic diagram, wherein the pseudo device 210 comprises a pseudo diode that reflects a different substantive voltage condition (e.g., 30V) associated with the respective N-well (DIO_NW30V). Consequently, the layout specialist will lay out the PMOS device of FIG. 3 differently than that of the PMOS device of FIG. 2. In addition, by coding that information into the pseudo layer of the resultant layout, the LVS check is able to verify whether the layout properly matches the circuit parameter that the schematic circuit designer intended.

In addition, the pseudo diode shown in FIGS. 2 and 3 can also be employed as a circuit modeling verification tool during computer-assisted circuit schematic testing. In the above embodiment, the pseudo diodes are reverse biased for all intended circuit conditions, and thus schematically do not affect circuit operation. However, if a circuit condition occurs, wherein the N-well voltage exceeds the intended voltage condition, the pseudo device operates as a clamp and begins conducting current reflecting an aberrant circuit operating condition. By running the circuit schematic simulations with the pseudo diodes, and monitoring whether one or more conduct in a clamping condition, the circuit designer can re-evaluate the circuit design to prevent the aberrant condition.

A chart 300 illustrating various examples of pseudo devices (e.g., pseudo diodes) is provided in FIG. 4. The chart 300 includes a first column 302 listing example names for various pseudo devices. In one embodiment, a name is provided that is relatively descriptive, however, any tag or naming convention can be employed. For example for pseudo diodes employed as pseudo devices, a descriptor DIO is used to describe a diode, and the NW indicates that the pseudo diode is associated with an N-well. Lastly, the 40V portion indicates a voltage condition associated with the pseudo diode.

The chart 300 includes a second column 304 that indicates what pseudo layer is employed for the given pseudo device. For example, for 40V devices, the algorithm does not employ a pseudo layer, since a highest voltage condition (which in this embodiment is 40V) serves as a default condition. Thus, if no pseudo layer is coded, the layout specialist knows that design rules associated with the highest voltage condition is to be employed.

The chart 300 includes a third column 306 which provides an example SPICE model name for use in the schematic simulation process. In SPICE modeling, various names have certain characteristics that are employed in the modeling simulation. Thus a SPICE model name of DIO_WELL_V40_LBC7 may correspond to a diode associated with an N-well having a clamp voltage of 40V that resides in the LBC7 SPICE library in a particular system.

Lastly, the chart 300 includes a fourth column 308 related to the breakdown characteristic of the pseudo diodes. Thus, a voltage in this column 308 would constitute a breakdown condition of the pseudo device, causing substantial current conduction therein that may be used to flag an errant condition in the circuit schematic.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." It is also to be appreciated that elements and/or layers depicted herein are illustrated with particular dimensions relative to one another (e.g., layer to layer dimensions and/or orientations) for purposes of simplicity and ease of understanding, and that the actual dimensions of such elements/layers may differ substantially from that illustrated herein. Also, the term "exemplary" is merely meant to mean an example, rather than "the best". Further, it is also to be appreciated that the ordering of the acts described herein can be altered and that any such re-ordering is contemplated as falling within the scope of one or more aspects of the present invention.

What is claimed is:

1. A method of verifying consistency between a circuit schematic and a corresponding integrated circuit layout, comprising:
   identifying a voltage condition associated with a portion of the circuit schematic;
   assigning a pseudo diode to the portion of the circuit schematic that is uniquely associated with the identified voltage condition;
   coding a pseudo layer associated with an integrated circuit layout of the circuit schematic in accordance with content of the assigned pseudo diode;
   using a computer, verifying consistency between the circuit schematic and the corresponding integrated circuit layout by extracting the pseudo layer from the integrated circuit layout and comparing information of the pseudo layer to the assigned pseudo diode in the circuit schematic; and
   employing the pseudo layer information to verify the resultant integrated circuit layout to verify compliance with appropriate design rules associated with the pseudo layer information.

2. The method of claim 1, wherein the portion of the schematic comprises an N-well region formed within a P-type semiconductor body.

3. The method of claim 2, wherein the P-type semiconductor body comprises a substrate.

4. The method of claim 2, wherein the pseudo diode is assigned to a junction between the N-well and the P-type semiconductor body, wherein an anode of the pseudo diode is assigned to a node of the P-type semiconductor body, and a cathode of the pseudo diode is assigned to a node of the N-well region.

5. The method of claim 1, further comprising using the pseudo diode in a circuit schematic modeling simulation to ascertain whether the identified voltage condition is exceeded.

6. A method of verifying consistency between a circuit schematic and a corresponding integrated circuit layout, comprising:
   identifying a circuit parameter associated with a device element in the circuit schematic;
   assigning a pseudo device to the device element of the circuit schematic that is associated with the identified circuit parameter;
   coding a pseudo layer associated with an integrated circuit layout of the circuit schematic in accordance with content of the assigned pseudo device; and
   using a computer, verifying consistency between the circuit schematic and the corresponding integrated circuit layout by extracting the pseudo layer from the integrated circuit layout and comparing information of the pseudo layer to the assigned pseudo device in the circuit schematic;
   wherein coding the pseudo layer comprises laying out the integrated circuit layout in accordance with the circuit schematic, and using the pseudo device to code the pseudo layer for the device element; and
   wherein verifying the consistency comprises running a design rule checking algorithm that uses the coded pseudo layer to apply one or more associated layout rules to a portion of the integrated circuit layout having the device element.

7. The method of claim 6, wherein verifying the consistency comprises running a layout to schematic verification algorithm that includes comparing the information of the pseudo device to the pseudo layer, and indicating a successful verification if a match or predetermined relationship between the pseudo device and the pseudo layer exists.

8. The method of claim 6, wherein verifying the consistency comprises running a layout to schematic verification algorithm that includes comparing the information of the pseudo device to the pseudo layer, and generating a failure indication if a match or predetermined relationship between the pseudo device and the pseudo layer does not exist.

9. The method of claim 8, wherein the device element comprises a PMOS transistor, wherein a circuit parameter associated with the PMOS transistor comprises an N-well region formed within a P-type semiconductor body, and wherein the pseudo device comprises a pseudo diode.

* * * * *